(12) United States Patent
Shimizu et al.

(10) Patent No.: US 6,660,586 B2
(45) Date of Patent: Dec. 9, 2003

(54) SEMICONDUCTOR DEVICE AND PROCESS FOR MANUFACTURING SAME

(75) Inventors: Ippei Shimizu, Hyogo (JP); Satoshi Shimizu, Hyogo (JP); Tadashi Omae, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/096,488

(22) Filed: Mar. 13, 2002

(65) Prior Publication Data

US 2003/0013226 A1 Jan. 16, 2003

(30) Foreign Application Priority Data

Jul. 12, 2001 (JP) ........................................ 2001-211949

(51) Int. Cl.$^7$ .......................................... H01L 21/8234
(52) U.S. Cl. ........................ 438/257; 438/525; 438/532
(58) Field of Search ................................ 438/302, 514, 438/525, 530, 532, 554, 555, 556, 558, 559, 585, 257, 264, 266, 267, 289, 450

(56) References Cited

U.S. PATENT DOCUMENTS

| | | | | |
|---|---|---|---|---|
| 5,399,508 A | * | 3/1995 | Nowak | 438/291 |
| 5,498,556 A | * | 3/1996 | Hong et al. | 438/302 |
| 5,518,941 A | * | 5/1996 | Lin et al. | 438/291 |
| 5,663,080 A | * | 9/1997 | Cereda et al. | 438/450 |
| 5,814,541 A | * | 9/1998 | Shibata | 438/232 |
| 6,306,738 B1 | * | 10/2001 | Selcuk | 438/525 |

FOREIGN PATENT DOCUMENTS

| | | |
|---|---|---|
| JP | 6-61504 | 3/1994 |
| JP | 9-148458 | 6/1997 |
| JP | 3071401 | 5/2000 |

OTHER PUBLICATIONS

"0.1μm Level Contact Hole Pattern Formation with KrF Lithography by Resolution Enhancement Lithography Assited by Chemical Shrink (RELACS)", (Papers for IEDM (International Election Devices Meeting) 98 held by IEEE (Institute of Electrical and Electronics Engineers), T. Toyoshima et al., pp. 333 to pp. 336.

* cited by examiner

Primary Examiner—Phat X. Cao
Assistant Examiner—Theresa T. Doan
(74) Attorney, Agent, or Firm—McDermott, Will & Emery (57) ABSTRACT

A process for manufacturing a semiconductor device includes the following steps applied to a semiconductor substrate having, on its main surface, a plurality of separation oxide films, formed in stripes parallel to each other, and gate oxide films formed in the regions placed between separation oxide films, wherein pieces of a polysilicon layer are formed so as to extend from areas above gate oxide films to areas above portions of separation oxide films on both sides of the gate oxide films and wherein a first resist is formed so as to cover the top surfaces of polysilicon layer: the injection step of injecting an impurity into polysilicon layer above separation oxide films; and the thermal diffusion step of carrying out a heat processing so that the injected impurity diffuses to the regions above gate oxide films within polysilicon layer.

2 Claims, 10 Drawing Sheets

FIG. 17    PROIR ART

FIG. 18    PROIR ART

SEMICONDUCTOR DEVICE AND PROCESS FOR MANUFACTURING SAME

BACKGROUND OF THE INVENTION

1. Field of the Invention

The present invention relates to a semiconductor device having a gate oxide film, such as a transistor, and to a process for manufacturing a semiconductor device.

2. Description of the Background Art

Figure 14:
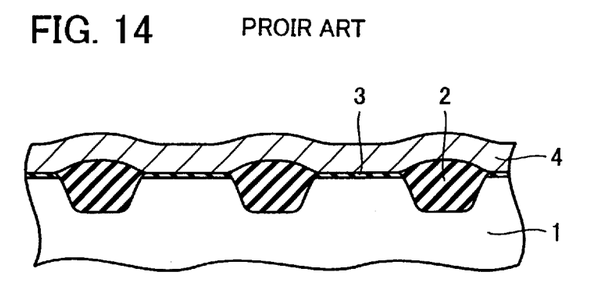
FIG. 14 is an explanatory view of one step of a process for a semiconductor device according to a prior art.

Conventionally, a process for manufacturing a semiconductor device having a gate oxide film, such as a transistor, includes the step of forming a gate electrode. The steps up to the point of the preparation of a material to be a gate electrode on a substrate are described in reference to FIG. 14. A gate oxide film 3 is formed on the main surface of a semiconductor substrate 1, such as a silicon wafer. Next, a separation oxide film 2 is formed through thermal oxidation, or the like. Furthermore, a polysilicon (polycrystal silicon) layer 4 is layered so as to cover the top surface of this substrate. FIG. 14 shows the condition wherein the above steps up to this point have been completed. Here, only the formation of polysilicon layer 4 without any impurities mixed in fails to provide sufficient conductivity for allowing the functions as a gate electrode. In order to enhance the conductivity of polysilicon layer 4, it is desirable to make polysilicon layer 4 be a polysilicon layer which includes predetermined impurities.

There are several methods for making polysilicon layer 4 be a polysilicon layer 4 including predetermined impurities.

First, there is a method wherein polysilicon layer 4 becomes a doped polysilicon layer 4a, that is to say, a method for forming the layer under the condition where impurities are added in advance. Concretely, at the time of silicon deposition by means of a CVD (chemical vapor deposition) method, for example, a gas mixture where $PH_3$ is added to $SiH_4$ is used. In this manner, doped polysilicon layer 4a, which includes phosphorous as an impurity, can be initially formed. This is advantageous in the point that the number of steps can be reduced because it is not necessary to inject phosphorous as an impurity in a subsequent process.

Figure 15:
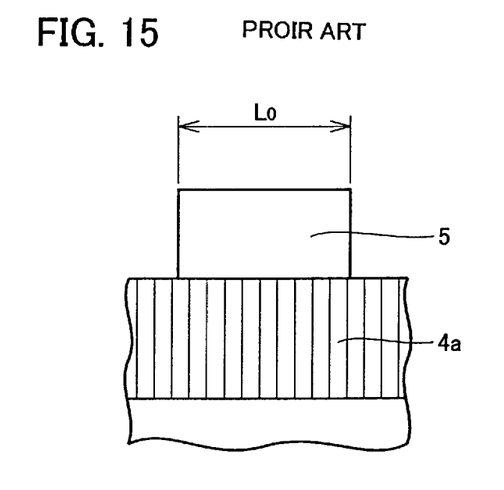
FIG. 15 is a first explanatory view of an etching step in a process for a semiconductor device according to a prior art.
Figure 16:
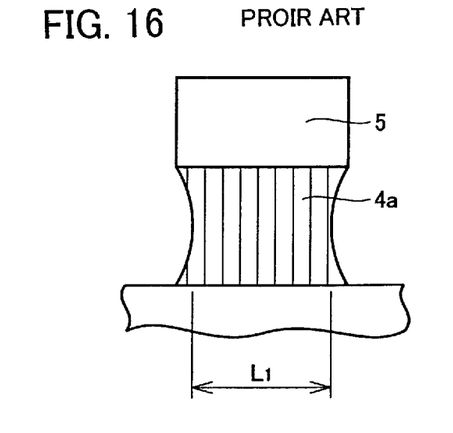
FIG. 16 is a second explanatory view of an etching step in a process for a semiconductor device according to a prior art.

The initial formation of doped polysilicon layer 4a, however, already includes large crystal grains. Accordingly, at the time of heating in the subsequent heat treatment steps for allowing the impurity distribution to be uniform, the silicon crystal grains grow remarkably so that the crystal grains become much larger. As a result, as shown in FIG. 15, at the time when etching is carried out by using a resist 5 as a mask in order to form the gate electrode into a desired structure, there is the disadvantage wherein separation of crystal grains occurs among crystal grains so that the surface formation of the sidewalls of the gate electrode becomes significantly deteriorated as shown in FIG. 16. In addition, the degree of occurrence of this separation varies depending on individual cells and this causes the problem of the dispersion of the characteristics of the cells when the product is completed.

Figure 17:
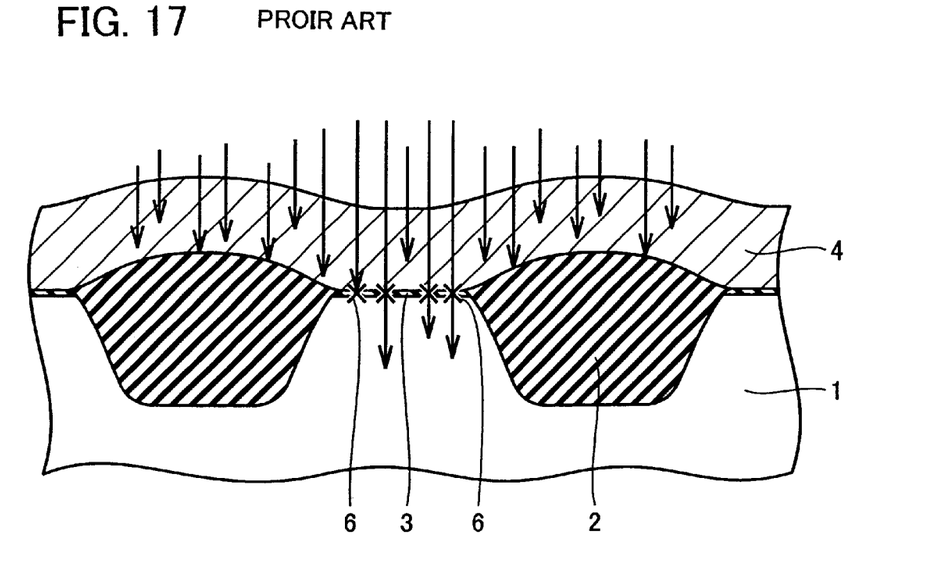
FIG. 17 is an explanatory view of an impurity injection step in a process for a semiconductor device according to a prior art.
Figure 18:
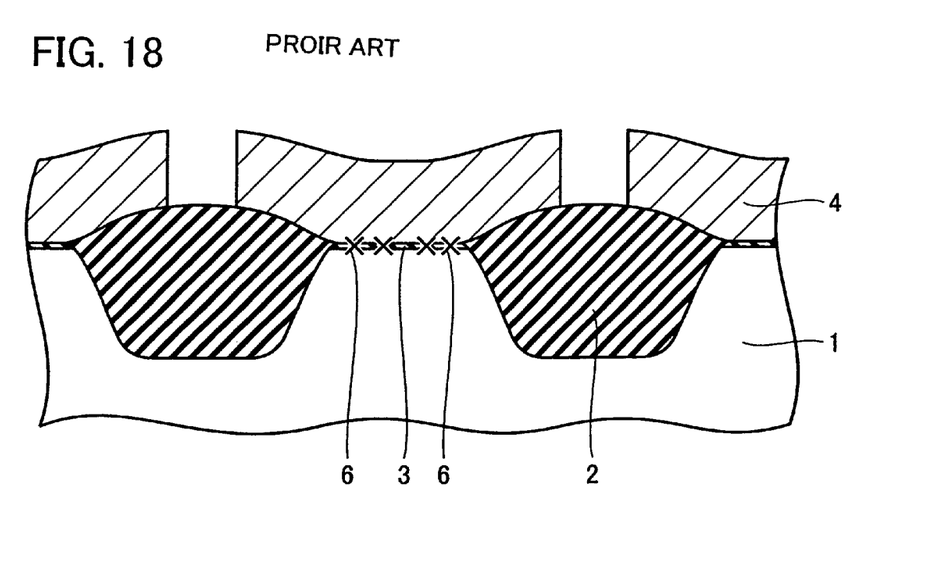
FIG. 18 is a cross section view of a semiconductor device according to a prior art.

There is another method where an impurity such as phosphorous is injected by means of an ion injection apparatus after first forming polysilicon layer 4 in the form of an undoped polysilicon layer which does not include impurities. In this case, the layer is formed in the condition wherein the crystal grains are small in comparison with the case of a doped polysilicon layer and, therefore, crystal grain growth can also be controlled at the time of subsequent heating. In the case of this method, however, impurity ions which have passed through the border between crystals, in pillar form, in polysilicon layer 4 reach to gate oxide film 3 as shown in FIG. 17 at the time of impurity injection and, thereby, in some cases, a defect 6 is caused in gate oxide film 3 or the impurity ions further penetrate to the lower side of gate oxide film 3 so as to enter the inside of the semiconductor substrate 1. As a result, the gained semiconductor device has a structure wherein defect 6 occurs in gate oxide film 3, as shown in FIG. 18. In this structure impurities are also included in the semiconductor substrate 1 beneath gate oxide film 3. This causes a problem wherein threshold voltage of cells is lowered or wherein a "punch through phenomenon" in which a leak current flows even in the case no voltage at all is applied to the gate electrode occurs.

Therefore, a purpose of the present invention is to provide a semiconductor device and a process for the same wherein no problems such as the separation of crystal grains, the defective formation of the gate oxide film or the invasion of impurities into the semiconductor substrate occur.

SUMMARY OF THE INVENTION

In order to achieve the above described purpose, a semiconductor device according to the present invention is provided with a semiconductor substrate, a plurality of separation oxide films formed in stripes parallel to each other in a first direction on the main surface of the above substrate, gate oxide films formed in regions placed between the above separation oxide films on the above main surface and gate electrodes formed so as to extend from areas on the above gate oxide films to areas on the above separation oxide films on both sides of the above gate oxide films, wherein the distribution of the impurity diffused inside of the above gate electrodes is such that the impurity concentration is high on both sides and is low in the middle when the distribution is displayed by scanning in the direction perpendicular to the above first direction in an arbitrary plane parallel to the above main surface across the above gate electrodes. By adopting this configuration, the semiconductor device can be manufactured by means of a method wherein an impurity is injected from the sidewalls on both sides in the width direction of the gate electrodes before being diffused to the center through heat treatment and there is no risk of defect occurrence in the gate oxide films or of invasion of an impurity into the lower sides of the gate oxide films.

In the above described invention, the above impurity is preferably phosphorous. By adopting this structure, a semiconductor device having gate electrodes in which an impurity is uniformly diffused because phosphorous is easily diffused as an n-type impurity.

In order to achieve the above described purpose, a process for a semiconductor device according to the present invention includes the injection step of injecting an impurity to a semiconductor substrate structure having, on its main surface, a plurality of separation oxide films formed in stripes parallel to each other in a first direction and gate oxide films formed in regions placed between the above separation oxide films and having pieces of polysilicon layer formed so as to extend from areas on the above gate oxide films to areas on portions of the above separation oxide film as well as a first resist which covers the top surface of the polysilicon layer so that the impurity is injected into the above polysilicon layer located above the above separation oxide films and the heat diffusion step wherein a heat treatment is carried out so that the above impurity injected in the above injection step diffuses to regions located above the above gate oxide films within the above polysilicon layer. By adopting this method an impurity injection can be carried out to the polysilicon layer only above the separation oxide films, which are at a distance away from the gate oxide films, while the areas above the gate oxide films are protected by the resist and, therefore, even in the case that the impurity penetrates through the polysilicon layer, it only strikes the top surfaces of the separation oxide films and the injected impurity can be prevented from directly reaching to the gate oxide films and from invading into the semiconductor substrate beneath the gate oxide films.

In the above described invention, the above polysilicon layer preferably has sidewalls above the above separation oxide films and the above first resist covers the top surfaces of the above polysilicon layer in the same ranges as the above pieces of the polysilicon layer while the process includes a resist removal step of removing the above first resist after the above injection step and before the above heat diffusion step and, the above impurity is diagonally injected in the above injection step so as to enter into the above sidewalls. By adopting this method, an impurity injection can be carried out leaving the resist used as a mask in etching as it is.

In the above described invention, the above first resist, preferably, selectively covers the top surface of the above polysilicon layer and the process includes a resist removal step of removing the above first resist after the above injection step, a second resist formation step of forming a second resist in desired pattern on the above polysilicon layer after the above heat diffusion step and the etching step of etching the above polysilicon layer by using the above second resist as a mask wherein the impurity is injected from the top surface from which the above polysilicon layer is exposed in the above injection step. By adopting this method, the volume of the impurity entrance regions can be made large so that a heat treatment can be carried out under the condition wherein more impurity is retained. Accordingly, a large amount of impurity can be diffused efficiently in the entirety of the polysilicon layer.

In the above described invention, the process preferably includes the opening region reduction step of narrowing the regions wherein the above first resist is opened and the etching step of etching the above polysilicon layer by using the above first resist as a mask and the impurity is injected from the top surface from which the above polysilicon layer is exposed in regions wherein the above first resist is opened in the above injection step. By adopting this method, impurity entrance regions greater in size by an additional amount wherein the openings in the resist are narrowed and, therefore, the heat treatment can be carried out under the condition wherein a larger amount of impurity becomes included. Since the openings are narrowed, a constant volume of impurity entrance regions is made to remain, without fail, after etching and, thereby, it becomes unnecessary to diagonally inject the impurity and it becomes possible to carry out impurity injection in the direction perpendicular to the main surface.

In the above described invention, phosphorous is preferably used as the above impurity. By adopting this method the impurity can be diffused more uniformly since phosphorous is easily diffused as an n-type impurity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
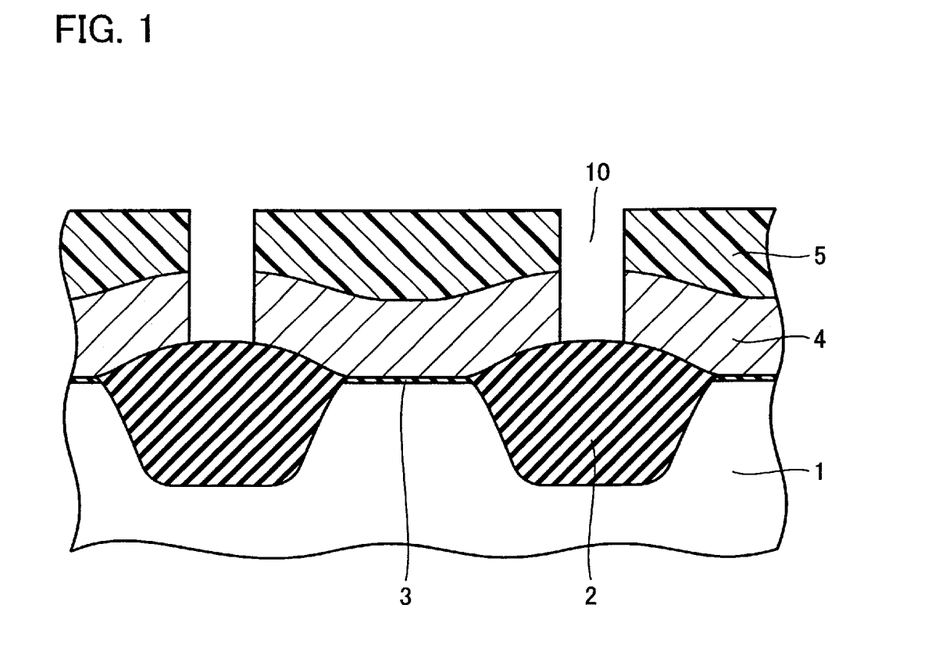
FIG. 1 is an explanatory view of the first step of a process for a semiconductor device according to First Embodiment of the present invention.
Figure 2:
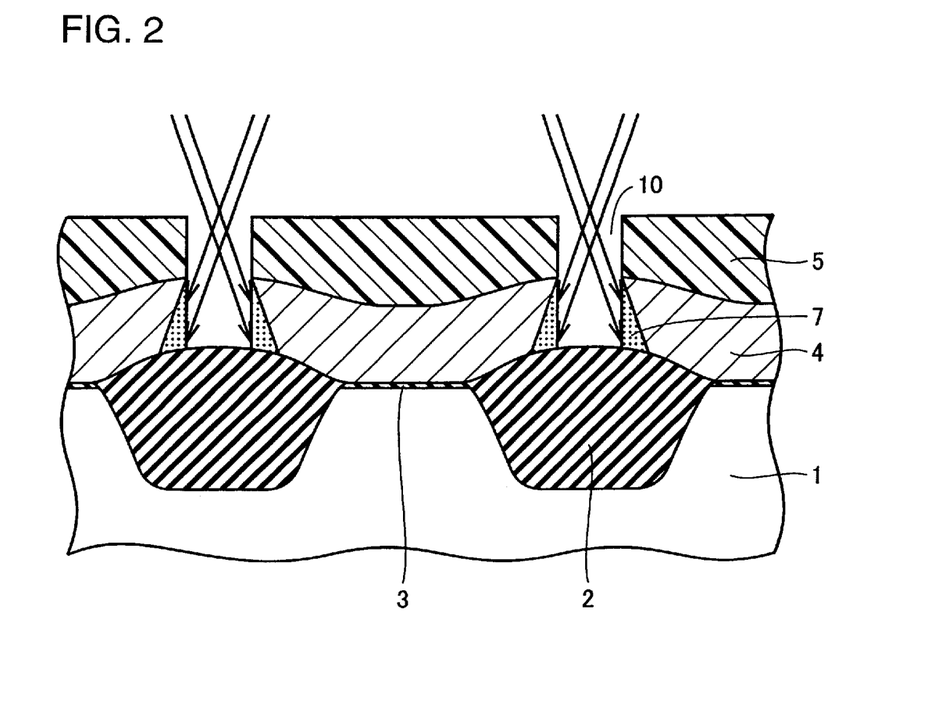
FIG. 2 is an explanatory view of the second step of the process for a semiconductor device according to First Embodiment of the present invention.

In reference to FIGS. 1 to 3 and 4A, a process for a semiconductor device according to First Embodiment of the present invention is described. FIG. 1 shows a cross section view at a specific point in time in this process for a semiconductor device. A plurality of separation oxide films 2 in stripes parallel to each other are formed in the direction perpendicular to the paper surface on the main surface of a semiconductor substrate 1. Gate oxide films 3 are formed in regions placed between separation oxide films 2. A polysilicon layer 4 is formed so as to cover the top surfaces of separation oxide films 2 and gate oxide films 3, and a resist 5 covers the top surface of polysilicon layer 4. Polysilicon layer 4 is a layer which becomes gate electrodes and is etched by using resist 5 to a which a specific pattern is given as a mask in order to form the gate electrodes and, as a result of the creation of openings 10, pieces of the polysilicon layer extend from areas above gate oxide films 3 to areas above portions of separation oxide films 2 on both sides of the gate oxide films while resist 5 is in a form which covers the same ranges of polysilicon layer 4. As shown in FIG. 2, phosphorous is injected as an impurity by using resist 5 as a mask. At the time of this injection, the top surface of polysilicon layer 4 is covered with resist 5 and, therefore, entrance of the impurity into polysilicon layer 4 becomes possible only from the sidewalls of polysilicon layer 4. Accordingly, in order to allow the impurity to enter into polysilicon layer 4, the impurity is injected diagonally, as shown in FIG. 2, instead of in the direction perpendicular to the main surface. As a result, impurity entrance regions 7 are formed in the vicinity of the sidewalls of polysilicon layer 4. At this point in time, the impurity mainly stays in the impurity entrance regions 7 and is not spread to the inside of polysilicon layer 4.

Figure 3:
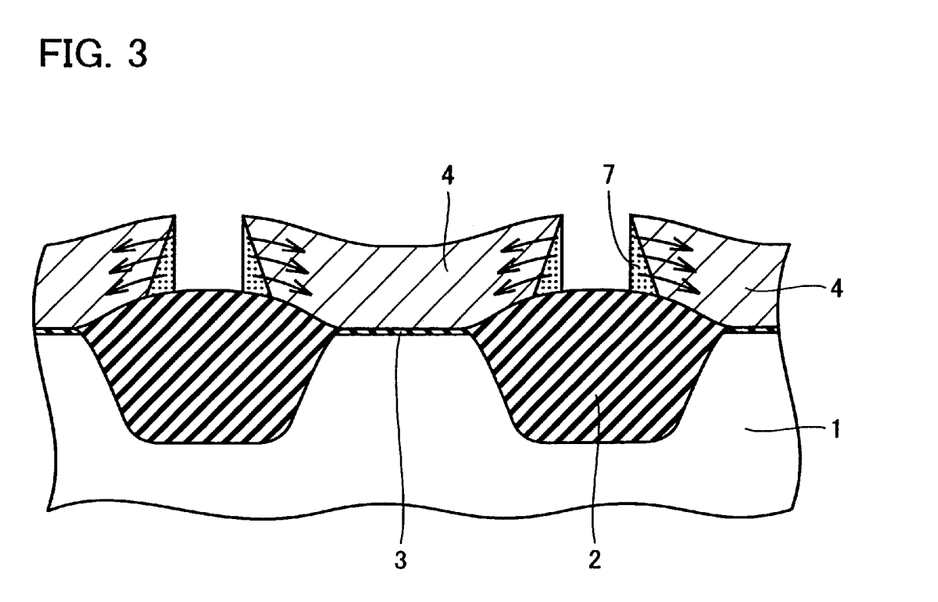
FIG. 3 is an explanatory view of the third step of the process for a semiconductor device according to First Embodiment of the present invention.
Figure 4A:
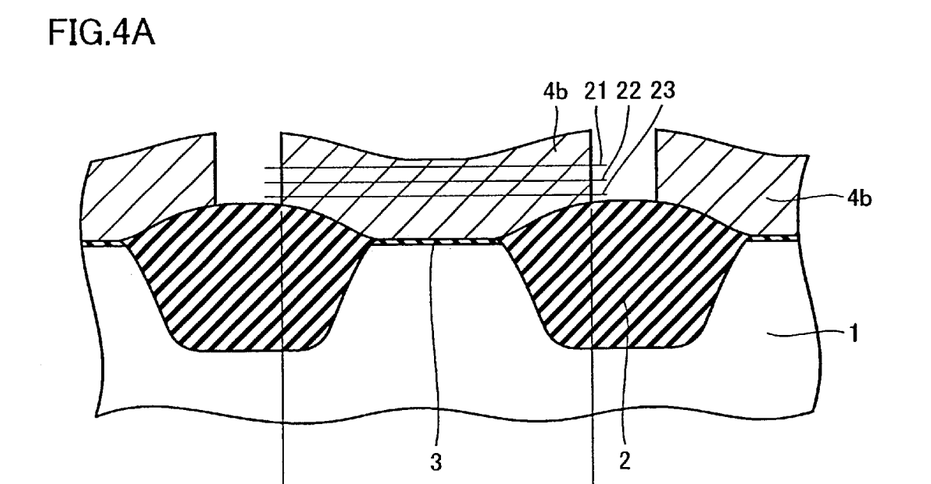
FIG. 4A is a cross section view of a semiconductor device according to First Embodiment of the present invention and FIG. 4B is a graph showing the impurity concentration of phosphorous.

Resist 5 is removed and a heat treatment is applied, as shown in FIG. 3, so that the impurity is diffused to other regions inside of polysilicon layer 4 from impurity entrance regions 7. The heat treatment is carried out at approximately 700° C. to 1100° C. The length of time for which this temperature is maintained is from approximately 10 minutes to 2 hours in the case of an FA (furnace anneal) system wherein the entirety undergoes heating from the surroundings in an electric furnace and is from approximately 1 second to 300 seconds in the case of an RTP (rapid thermal process) system wherein heating is carried out for a short period of time by concentrating light with a reflection plate. As a result, as shown in FIG. 4A, a polysilicon layer 4b wherein the impurity is diffused in the entire region is gained. A semiconductor device is constructed by using this polysilicon layer 4b as gate electrodes.

Figure 4B:
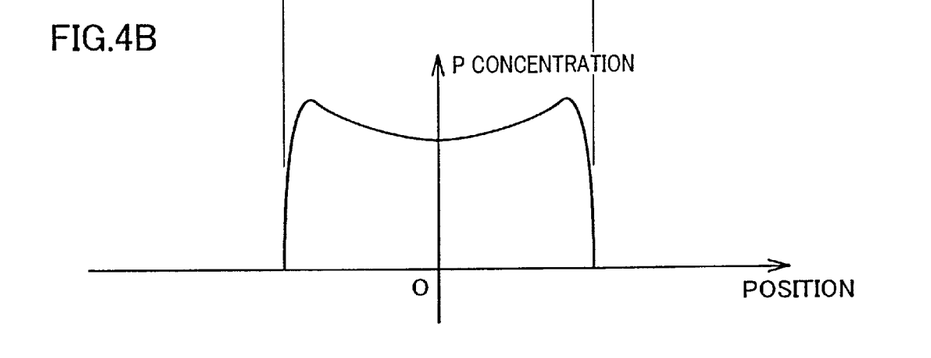

In reference to FIGS. 4A and 4B, a semiconductor device according to First Embodiment of the present invention is described. This semiconductor device is characterized by the distribution of the impurity concentration diffused inside of polysilicon layer 4b as gate electrodes. That is to say, according to a graph representation through scanning, the impurity distribution in the direction perpendicular to the longitudinal direction of the gate electrode in a cross section on an arbitrary plane parallel to the main surface across the gate electrode such as planes 21, 22 or 23 in FIG. 4A, the impurity has a distribution wherein the concentration is high on both sides in the width direction of the gate electrode and low in the middle, as shown in FIG. 4B. The reason for the occurrence of the difference of high and low in the impurity concentration in such a manner is that the impurity inside of polysilicon layer 4b is originally diffused from impurity entrance regions 7, formed on both ends in the width direction of the gate electrode, to the entirety of the layer and, therefore, a difference occurs between both ends, which are impurity entrance regions 7 from the beginning, and the center to which the impurity has arrived for the first time after diffusion. Here, the pattern of this distribution is the same in a cross section at other levels across the gate electrode.

As an example, in the case that the impurity injection is carried out under the conditions of incident angle of 5° to 60°, acceleration energy of 5 keV to 50 keV and an injection amount of $5 \times 10^{13}/cm^2$ to $5 \times 10^{16}/cm^2$, the concentration is approximately $10^{19}/cm^3$ to $10^{21}/cm^3$ in the center of the gate electrode and approximately $10^{20}/cm^3$ to $10^{22}/cm^3$ on both sides.

When a semiconductor device is manufactured according to the above described process, an impurity can be injected to polysilicon layer 4 only above separation oxide films 2 which is at a distance away from gate oxide films 3 while areas above gate oxide films 3 are protected by resist 5 and, therefore, even if the impurity penetrates through polysilicon layer 4, it only strikes the top surfaces of separation oxide films 2 and the injected impurity never reaches directly to gate oxide films 3 nor ever enters into semiconductor substrate 1 beneath gate oxide films 3. Even in the case that the impurity strikes the top surfaces of separation oxide films 2, semiconductor substrate 1 and gate oxide films 3 are not affected. Accordingly, the occurrence of defects in gate oxide films 3 or invasion of the impurity into semiconductor substrate 1 can be prevented.

Second Embodiment

Figure 5:
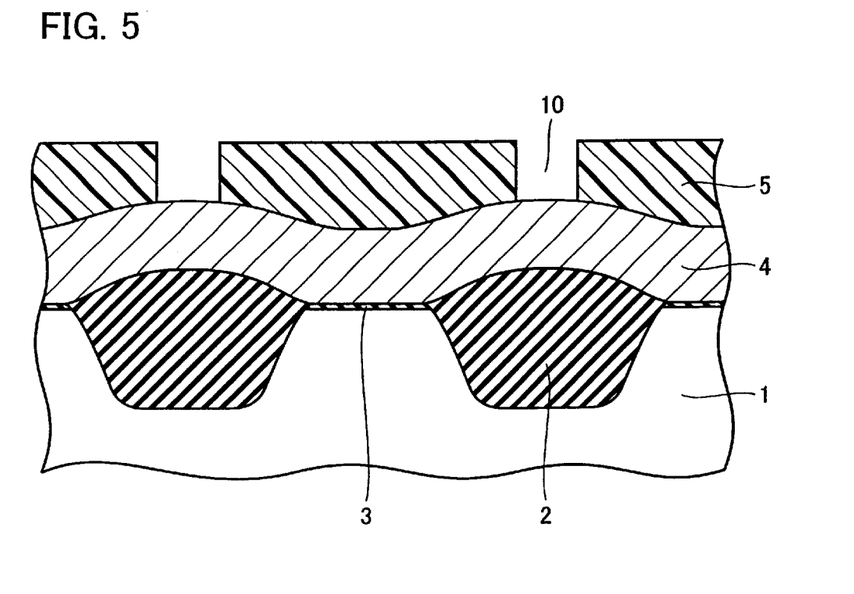
FIG. 5 is an explanatory view of the first step of a process for a semiconductor device according to Second Embodiment of the present invention.
Figure 6:
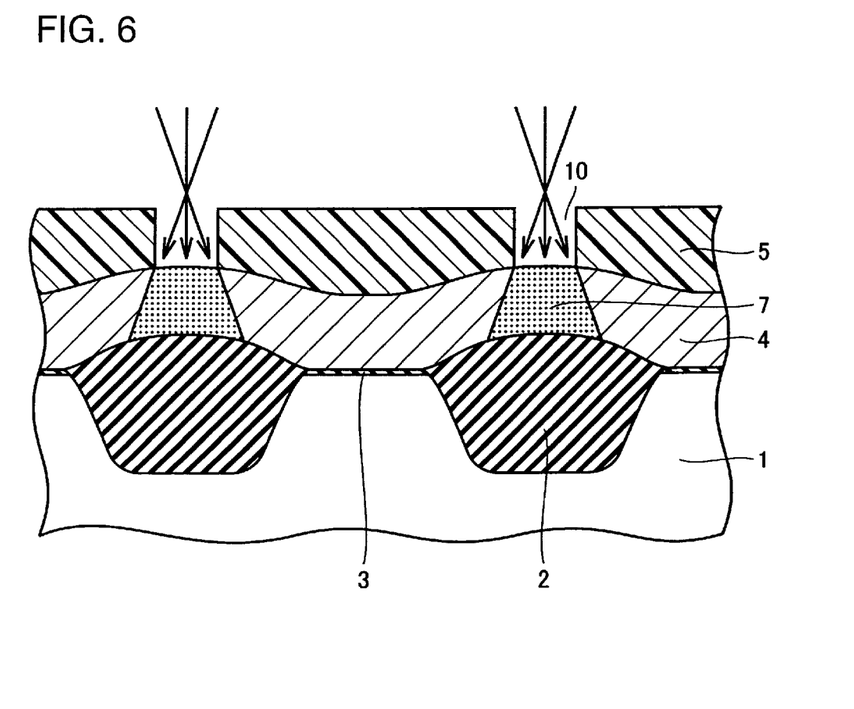
FIG. 6 is an explanatory view of the second step of the process for a semiconductor device according to Second Embodiment of the present invention.

In reference to FIGS. 5 to 8 and 9A, a process for a semiconductor device according to Second Embodiment of the present invention is described. FIG. 5 shows a cross section view at a specific point in time of this process for a semiconductor device. Though this is similar to the structure described in First Embodiment in reference to FIG. 1, openings 10 are different. Though, in the structure shown in FIG. 1 etching of polysilicon layer 4 has already been carried out by using resist 5 as a mask, in the structure shown in FIG. 5 openings 10 are created in only resist 5 so that the top surfaces of polysilicon layer 4 are exposed in the inside of openings 10. As shown in FIG. 6, phosphorous is injected as the impurity by using resist 5 as a mask. As a result, impurity entrance regions 7 are formed in portions of polysilicon layer 4 which are exposed within openings 10 and in the vicinity thereof. Here, though in this example the impurity injection is carried out diagonally relative to the main surface, it may be carried out vertically.

Figure 7:
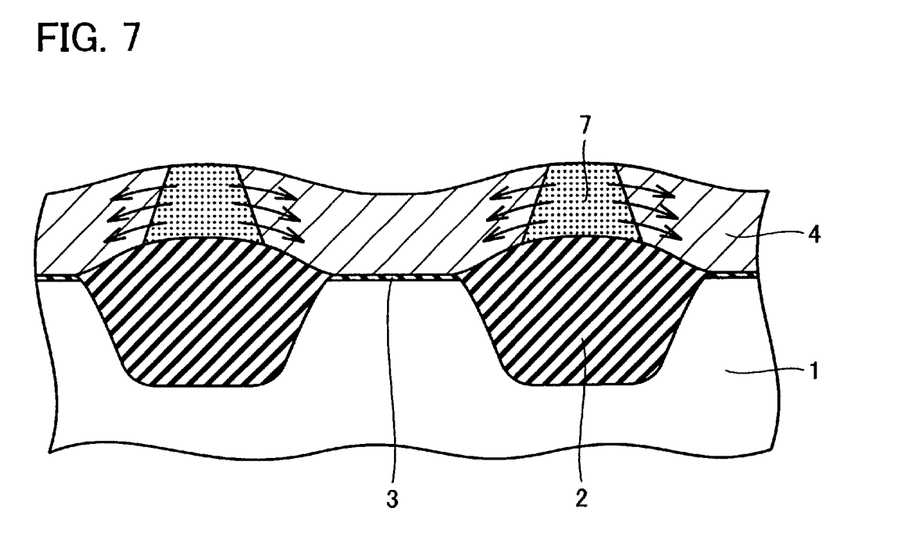
FIG. 7 is an explanatory view of the third step of the process for a semiconductor device according to Second Embodiment of the present invention.
Figure 8:
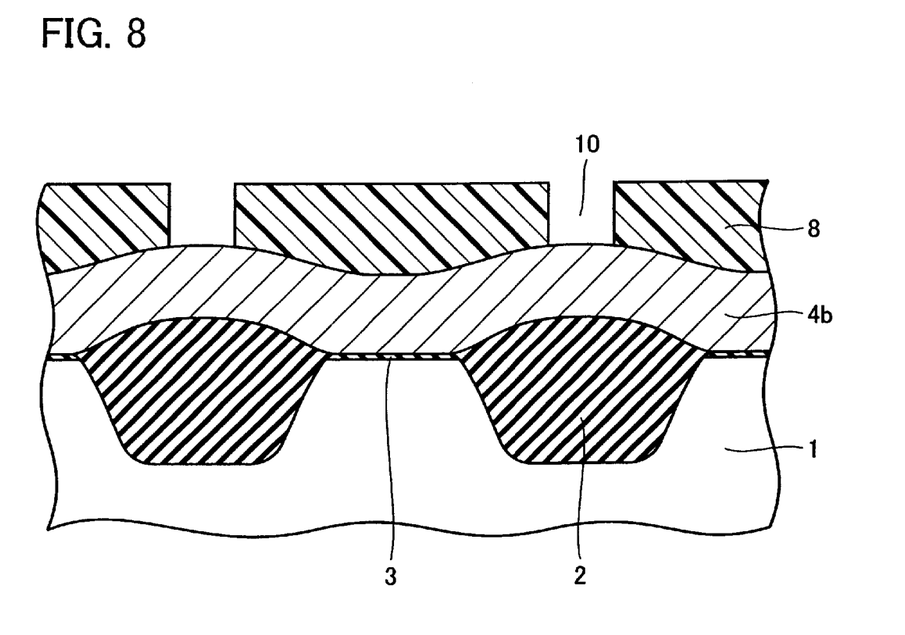
FIG. 8 is an explanatory view of the fourth step of the process for a semiconductor device according to Second Embodiment of the present invention.
Figure 9A:
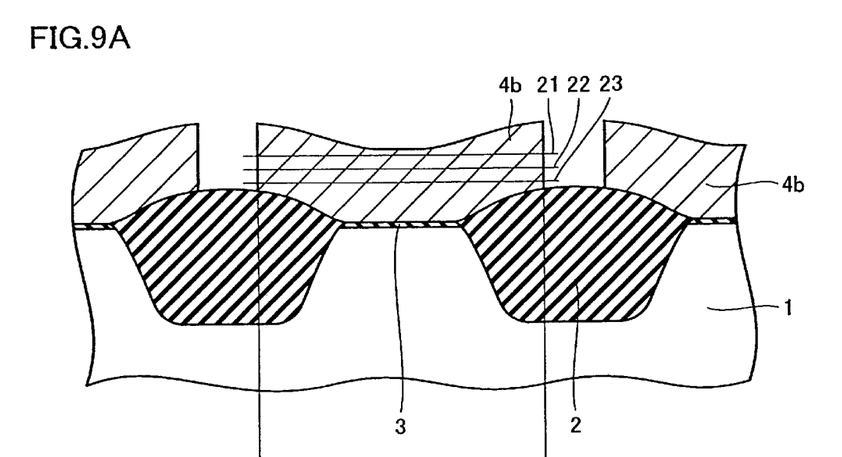
FIG. 9A is a cross section view of a semiconductor device according to Second Embodiment of the present invention and FIG. 9B is a graph showing the impurity concentration of phosphorous.

Resist 5 is removed and a heat treatment is applied, as shown in FIG. 7, so that the impurity is diffused into other regions inside of polysilicon layer 4 from impurity entrance regions 7. The conditions for the heat treatment are the same as described in First Embodiment. As a result, a polysilicon layer 4b wherein the impurity is diffused in the entire region is gained. As shown in FIG. 8, resist 8 is newly formed so as to cover the top surface of polysilicon layer 4b and patterning for forming gate electrodes is carried out. Etching is carried out by using resist 8 as a mask so as to form gate electrodes from polysilicon layer 4b. As a result, the structure shown in FIG. 9A is gained. A semiconductor device is constructed by using this polysilicon layer 4b as gate electrodes.

Figure 9B:
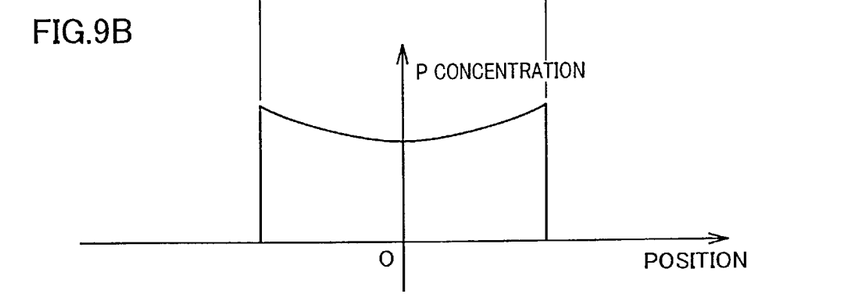

This semiconductor device is characterized by the distribution of the impurity concentration which has been diffused inside of polysilicon layer 4b as gate electrodes. That is to say, according to a graph representation through scanning, the impurity distribution in the direction perpendicular to the longitudinal direction of the gate electrode in a cross section on an arbitrary plane parallel to the main surface across the gate electrode such as planes 21, 22 or 23 in FIG. 9A, the impurity has a distribution wherein the concentration is high on both sides in the width direction of the gate electrode and low in the middle, as shown in FIG. 9B. The reason for the occurrence of the difference of high and low in the impurity concentration in such a manner is that the impurity inside of polysilicon layer 4b is originally diffused from impurity entrance regions 7, formed on both ends in the width direction of the gate electrode as well as in the positions corresponding to the extension thereof, to the entirety of the gate electrode and, therefore, a difference occurs between both end portions, which are close to impurity entrance regions 7, and the center to which the impurity has arrived for the first time after diffusion. Here, the pattern of this distribution is the same in a cross section at other levels across the gate electrode.

As an example, in the case that the impurity injection is carried out under the conditions of incident angle of 0° to 60°, acceleration energy of 5 keV to 50 keV and an injection amount of $5\times10^{13}/cm^2$ to $5\times10^{16}/cm^2$, the concentration is approximately $10^{19}/cm^3$ to $10^{21}/cm^3$ in the center of the gate electrode and approximately $10^{20}/cm^3$ to $10^{22}/cm^3$ on both sides.

In this embodiment, since an impurity can be injected from the top surfaces wherein polysilicon layer 4 is exposed, the volume of impurity entrance regions 7 can be made greater than in the case of First Embodiment. That is to say, a heat treatment can be carried out under the condition where a larger amount of impurity is retained. Accordingly, a large amount of impurity can be efficiently diffused to the entirety of polysilicon layer 4.

Third Embodiment

Figure 10:
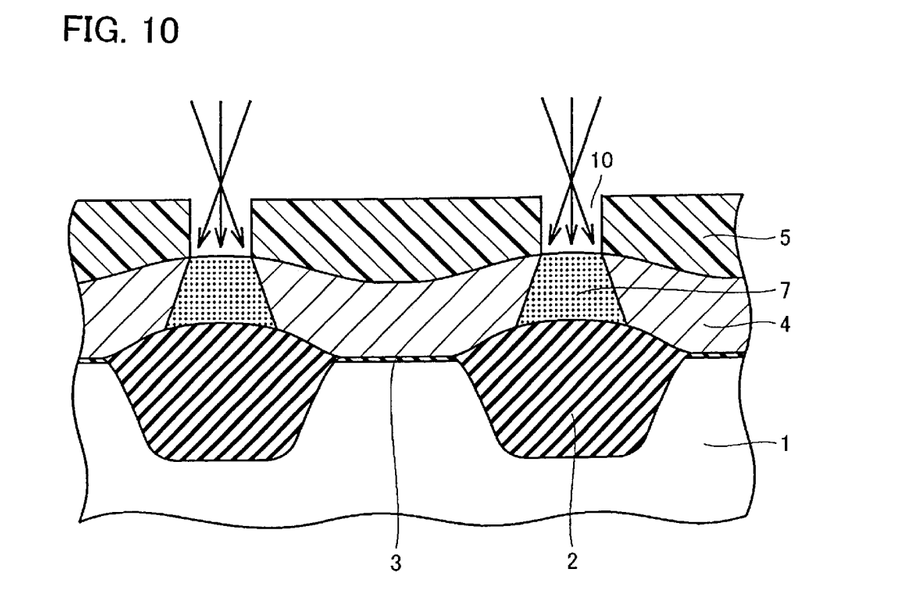
FIG. 10 is an explanatory view of the first step of a process for a semiconductor device according to Third Embodiment of the present invention.

In reference to FIGS. 10 to 13, a process for a semiconductor device according to Third Embodiment of the present invention is described. FIG. 10 shows a cross section view at a specific point in time of this process for a semiconductor device. The top surfaces of polysilicon layer 4 are exposed inside of openings 10. Phosphorous is injected as the impurity by using resist 5 as a mask. As a result, impurity entrance regions 7 are formed in portions of polysilicon layer 4 which are exposed within openings 10 and in the vicinity thereof. Here, though, in this example the impurity injection is carried out diagonally relative to the main surface, it may be carried out vertically.

Although, in Second Embodiment, resist 5 is removed after the above, in the present embodiment an RELACS (resolution enhancement lithography assisted by chemical shrink) method is carried out as an opening region reduction step without removing resist 5. The RELACS method is a method described in a paper by T. Toyoshima et al. "0.1 μm Level Contact Hole Pattern Formation with KrF Lithography by Resolution Enhancement Lithography Assisted by Chemical Shrink (RELACS)" (Papers for IEDM (International Electron Devices Meeting) 98 held by IEEE (Institute of Electrical and Electronics Engineers), pp. 333 to pp. 336). That is to say, according to the RELACS method, after the resist is patterned so that openings are created, a RELACS agent made of water soluble resin and a binding agent is applied so as to cover the top surface of the resist and, then, a heat treatment is carried out over a period of from several tens of seconds to one hundred and several tens of seconds at approximately 110° C. Due to this heat treatment, the RELACS agent and oxygen in the resist react to combine and a water insoluble layer grows on the sidewalls of the openings of the resist pattern. After that, the portions where the RELACS agent is not combined are washed off with water and, as a result, the openings of the resist pattern are narrowed. In addition, the detail of the RELACS method is disclosed in Japanese Patent No. 3071401.

Figure 11:
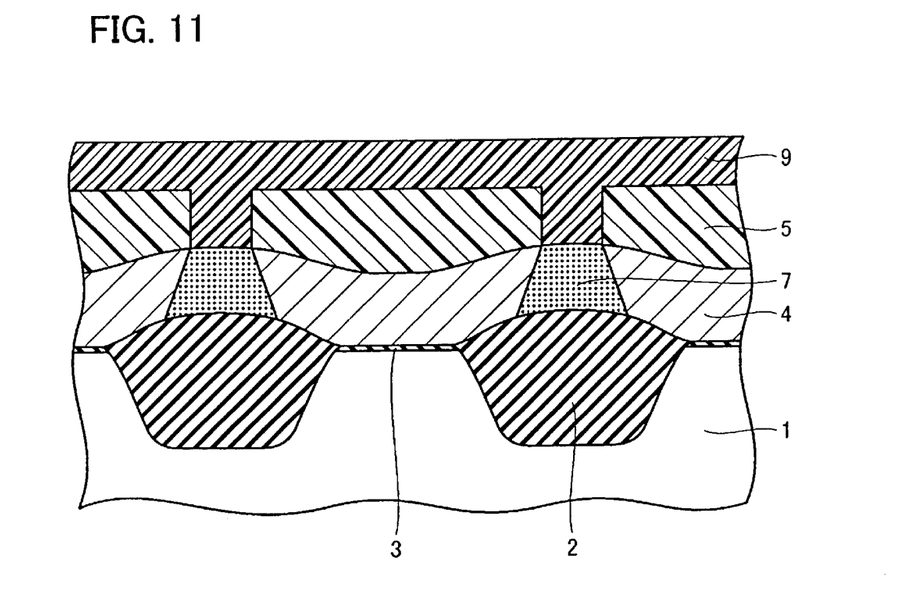
FIG. 11 is an explanatory view of the second step of the process for a semiconductor device according to Third Embodiment of the present invention.

In order to carry out the RELACS method, a RELACS agent 9 is applied so as to cover resist 5 and openings 10, as shown in FIG. 11. As for this RELACS agent 9, for example, a product of Clariant Japan KK "AZ (registered trademark)-R200" can be used.

Figure 12:
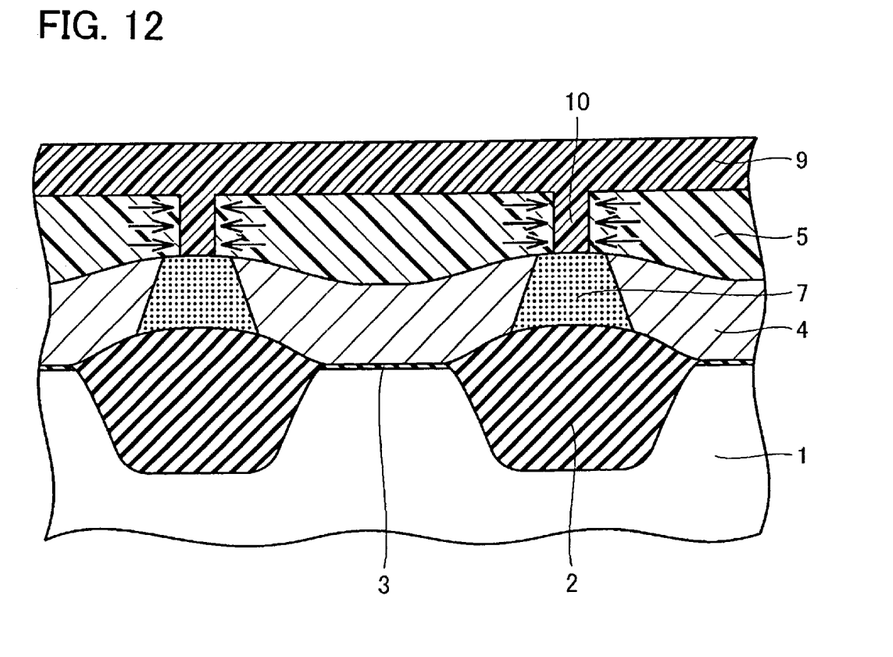
FIG. 12 is an explanatory view of the third step of the process for a semiconductor device according to Third Embodiment of the present invention.
Figure 13:
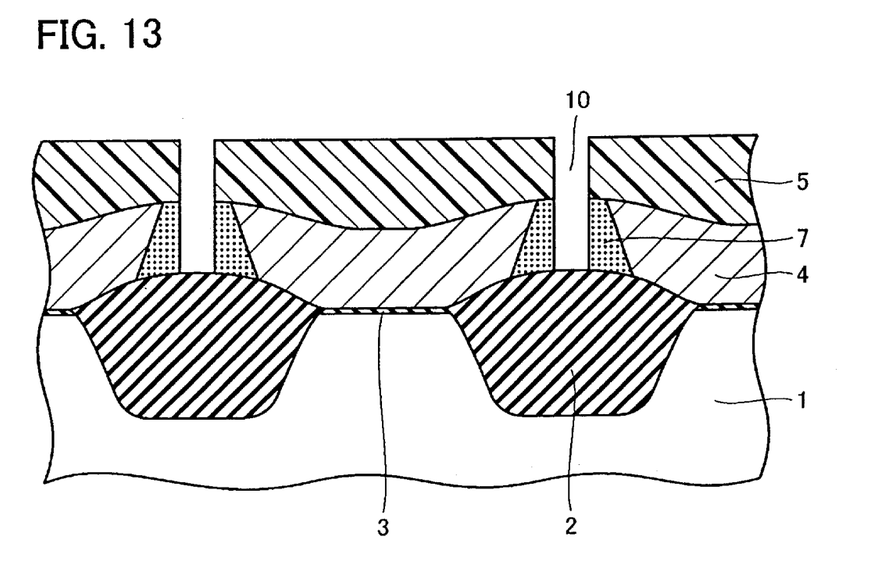
FIG. 13 is an explanatory view of the fourth step of the process for a semiconductor device according to Third Embodiment of the present invention.

By carrying out a heat treatment over a period of from several tens of seconds to one hundred and several tens of seconds at approximately 110° C. under the condition where the RELACS agent is applied, openings 10 in resist 5 are narrowed, as shown in FIG. 12. The RELACS agent is washed off and etching is carried out by using resist 5 as a mask so as to gain the structure shown in FIG. 13. After this, resist 5 is removed and a heat treatment is applied so that the impurity is diffused to other regions inside of polysilicon layer 4 from impurity entrance regions 7.

In comparison with the case of First Embodiment (see FIG. 2), in the present embodiment, impurity entrance regions 7 can be made larger by the amount by which openings 10 of resist 5 are narrowed by means of the RELACS method and, thereby, the heat treatment can be carried out under the condition where a large amount of impurity is included. In addition, after utilizing resist 5 as a mask for impurity injection, it is not removed but, rather, is utilized again as a mask for etching polysilicon layer 4 after the openings are narrowed by means of the RELACS method and, therefore, it is not necessary, unlike in Second Embodiment, to again form a resist for etching so that an increase in the number of steps avoided. Furthermore, by using the RELACS method, the so-called width of removed section between gate electrodes can be made narrower than in the cases of Embodiments 1 and 2 and, thereby, the capacitance coupling ratio can be raised and, as a result, the operational speed can be increased.

Though, in First Embodiment, the size of openings 10 is unchanged and the impurity injection to polysilicon layer 4 can only be carried out to the sidewalls exposed to openings 10 so that it is necessary to diagonally inject the impurity, in the present embodiment, openings 10 are narrowed by means of the RELACS method and the process can be applied even in the case the impurity injection is carried out in the direction perpendicular to the main surface in addition to the case wherein it is diagonally carried out.

In the process for a semiconductor device according to the present embodiment, the step of the RELACS method is only inserted between the impurity injection step and the step of the etching of the polysilicon layer and the previously existing steps can be utilized with little change for the remainder of the process.

Here, though in each of the above described embodiments phosphorous, which is an impurity for forming n-type gate electrodes, is used as the impurity, the present invention can be applied whether the gate electrodes to be formed are n-type or are p-type. In addition, even in the case of n-type, impurities other than phosphorous may be used.

According to the present invention impurity injection is carried out to the polysilicon layer only above the separation oxide films which are at a distance away from the gate oxide films while the polysilicon layer above the gate oxide films are protected by the resist and, therefore, even if the impurity penetrates the polysilicon layer, it only strikes the top surfaces of the separation oxide films so that the injected impurity can be prevented from directly reaching the gate oxide films and can be prevented from invading into the semiconductor substrate beneath the gate oxide films.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for manufacturing a semiconductor device which includes the following steps applied to a semiconductor substrate having, on its main surface, a plurality of separation oxide films formed in stripes parallel to each other in a first direction and gate oxide films formed in regions placed between said separation oxide films, wherein pieces of a polysilicon layer are formed so as to extend from areas above said gate oxide films to areas above portions of said separation oxide films on both sides of the gate oxide films and wherein first resist is formed so as to cover the top surfaces of said polysilicon layer:

the injection step of injecting an impurity into said polysilicon layer above said separation oxide films; and the thermal diffusion step of carrying out a heat treatment so that said impurity injected in said injection step diffuses into the regions above said gate oxide films within said polysilicon layer; wherein said pieces of the polysilicon layer have sidewalls above said separation oxide films while said first resist covers the top surfaces of said polysilicon layer in the same ranges of said pieces of the polysilicon layer, wherein the process further includes the resist removal step of removing said first resist after said injection step and before said thermal diffusion step, and wherein said impurity is injected diagonally so as to enter into said sidewalls in said injection step.

2. The process for manufacturing a semiconductor device according to claim 1, wherein phosphorous is used as said impurity.

* * * * *

UNITED STATES PATENT AND TRADEMARK OFFICE
CERTIFICATE OF CORRECTION

PATENT NO. : 6,660,586 B2
DATED : December 9, 2003
INVENTOR(S) : Ippei Shimizu et al.

It is certified that error appears in the above-identified patent and that said Letters Patent is hereby corrected as shown below:

<u>Title page,</u>
Item [73], Assignee, change "Mitsubishi Denki Kabushiki Kaisha" to -- Renesas Technology Corp. --

Signed and Sealed this

Thirteenth Day of July, 2004

JON W. DUDAS
*Acting Director of the United States Patent and Trademark Office*